United States Patent [19]
Dorren

[11] 3,937,902
[45] Feb. 10, 1976

[54] CARTRIDGE MUTING CIRCUIT

[75] Inventor: Louis Dorren, Millbrae, Calif.

[73] Assignee: Quadracast Systems, Inc., San Mateo, Calif.

[22] Filed: Apr. 18, 1974

[21] Appl. No.: 461,884

[52] U.S. Cl............. 179/100.4 A; 274/1 R; 360/61
[51] Int. Cl.²............................................. G11B 15/12
[58] Field of Search... 179/100.4 A, 100.4 R, 100.4 F, 179/100.41 T; 360/61, 62; 330/51; 274/1 R, 10 R

[56] References Cited
UNITED STATES PATENTS

| | | | |
|---|---|---|---|
| 3,144,522 | 8/1964 | Bernstein | 179/100.41 T |
| 3,280,272 | 10/1966 | Simpson | 274/1 R |
| 3,321,205 | 5/1967 | Dennis | 274/10 R |
| 3,334,194 | 8/1967 | Chang | 360/61 |
| 3,673,345 | 6/1972 | Ban | 360/74 |
| 3,705,272 | 12/1972 | Tsuji et al. | 362/62 |

*Primary Examiner*—Bernard Konick
*Assistant Examiner*—Stewart Levy
*Attorney, Agent, or Firm*—Robert G. Slick

[57] ABSTRACT

A muting circuit is provided for a phonograph record amplifier employing a semi-conductor cartridge wherein the cartridge has a shorting switch operative during the changing cycle wherein the amplifier associated with the cartridge is deactivated during the changing cycle of the pickup preventing transients in the output of the amplifier.

3 Claims, 2 Drawing Figures

CARTRIDGE MUTING CIRCUIT

SUMMARY OF THE INVENTION

In modern phonograph record changers a switch is provided which shorts the output of the cartridge when the changing cycle is taking place. This prevents noise in the output circuit which would otherwise be present, since the cartridge is subject to numerous vibrations and shocks during the changing cycle. With pickups which generate their own output voltage such as magnetic, crystal, ceramic and the like cartridges, this presents no problem. However, many phonograph changers use a semi-conductor cartridge which must be biased for operation. If this bias voltage is shorted out, it will produce a large transient spike on the output which is many times the normal output voltage of the cartridge and this spike would result in a final output from the amplifier of sufficient magnitude to blow out loud speakers and/or produce a catastrophic effect on the listeners.

In accordance with the present invention, a muting circuit is provided which uses a high speed analog gate to turn off the audio output of the amplifier before the transient appears at the output.

A diode is included in the muting circuit which is operative only during the muting period. At other times, the diode becomes reverse biased, presenting a very high impedance so that it does not interfere with the normal operation of the phonograph system.

A fast attack, slow decay circuit is provided so that the amplifier can stabilize before returning to its operative condition.

DESCRIPTION OF THE PREFERRED EMBODIMENT

Figure 1:
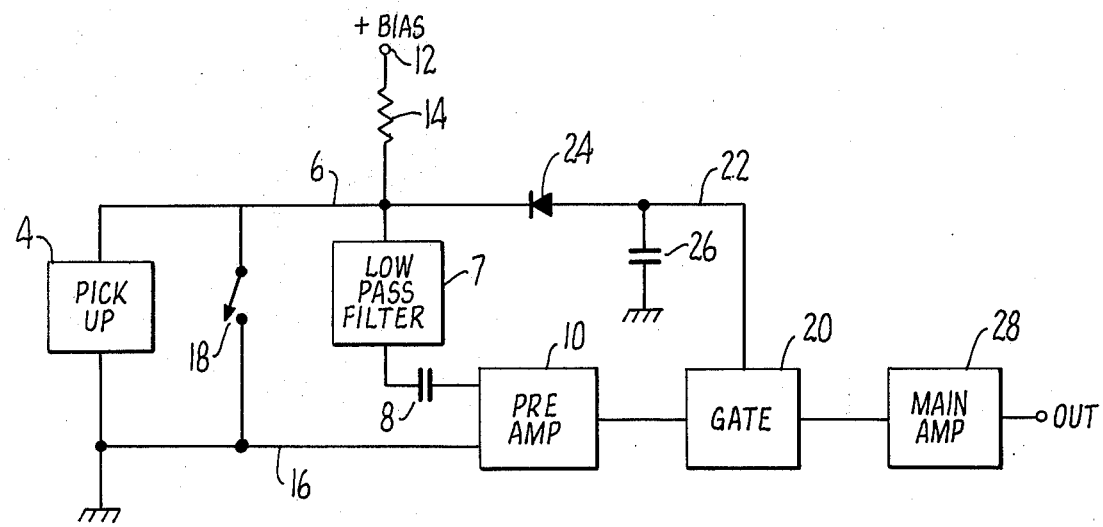
FIG. 1 is a block diagram of a muting circuit embodying the present invention.

Referring now to FIG. 1 of the drawings, there is shown a semiconductor pickup cartridge 4 which has an output line 6 wherein the normal output of the cartridge is passed through low pass filter 7 and capacitor 8 to a pre-amplifier 10. The cartridge is provided with a bias voltage from source 12 through resistor 14. The opposite side of the pickup cartridge and the amplifier are grounded through line 16. A switch 18 is provided on the changer itself so that while the changing operation is taking place, switch 18 is closed, grounding line 6 so that there will be no output from the pickup cartridge 4 during this period. However, with the circuitry thus far described, at the time switch 18 is closed, a large negative spike or transient will appear on line 6 and be fed to the amplifier. This transient voltage is many times the normal output voltage of the cartridge and, if it were passed through the amplifier in the usual way, would frequently be sufficient to blow out loud speakers.

In order to prevent this, the circuit of the present invention provides a gate, in the form of a semi-conductor switch 20. Gate 20 is connected between the pre-amplifier 10 and the final or main amplifier 28. The operating line 22 of the gate is connected through diode 24 to line 6. A capacitor 26 is also provided between line 22 and ground. Now as a large negative spike appears on line 6, it will pass through diode 24 and close gate 20 and charge capacitor 26. Since there is some delay introduced through filter 7 and capacitor 8, the spike or transient will be prevented from ever reaching the main amplifier. After the spike has passed, the charge on capacitor 26 will maintain the gate 20 closed for a short period of time until the charge can leak off. After the charge leaks off, gate 20 will again open so that the circuit can function in the normal way. It will be noted that the diode 24 now becomes reverse biased so that it presents a very high impedance and does not interfere with the normal operation of the system. Thus, the muting circuit of the present invention provides a fast attack and slow decay so that the circuitry will be instantly protected from a transient voltage and after the transient passes, the decay time is such that the pre-amplifier can stabilize and will not produce a second transient as the muting circuit opens and the amplifier again becomes operative.

Figure 2:
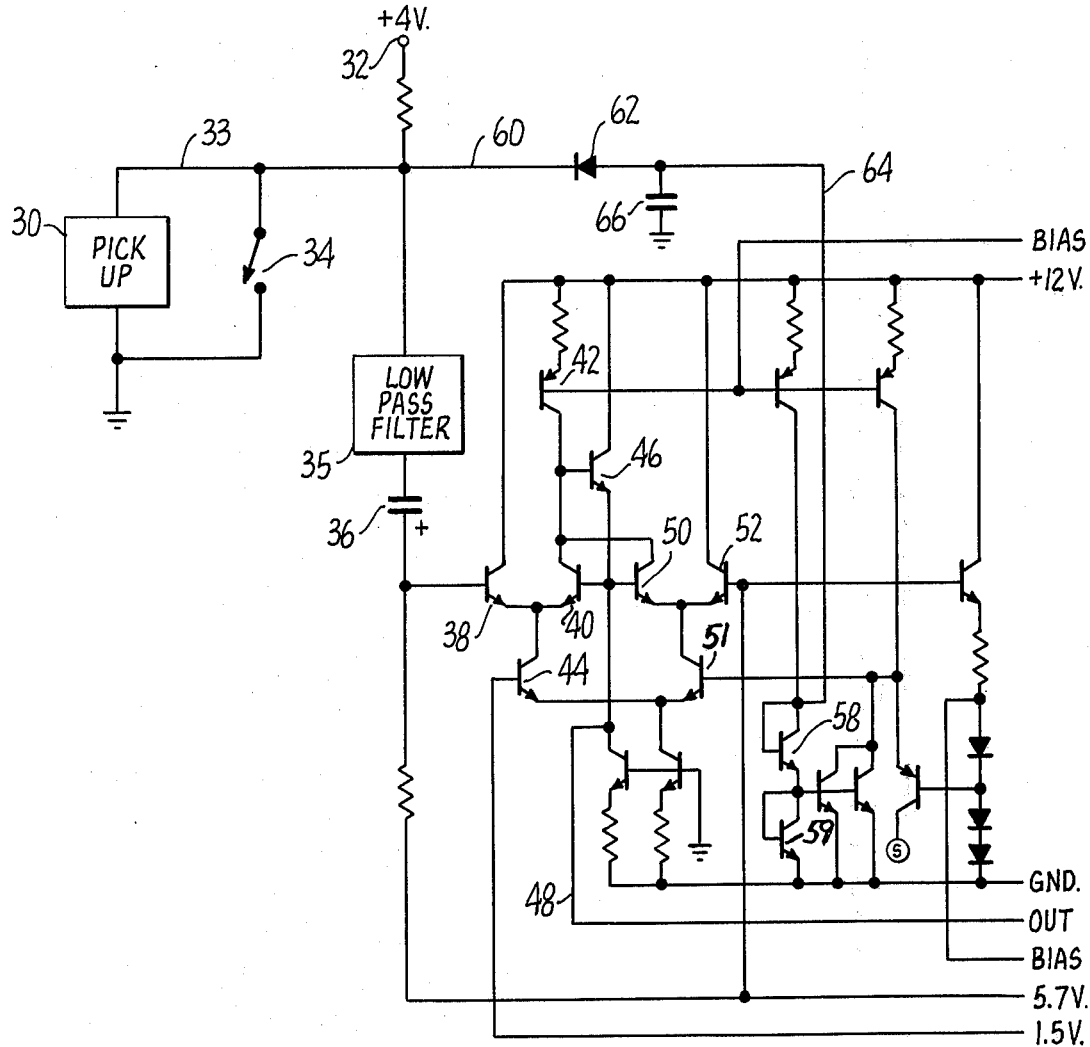
FIG. 2 is a detailed circuit diagram showing a practical embodiment of the invention.

In FIG. 2 a practical circuit is shown wherein a semiconductor pickup 30 is biased from source 32 through its output line 33 and is provided with a muting switch 34. The output is passed through low pass filter 35 and capacitor 36 to the base of transistor 38. Transistors 38 and 40 constitute a differential amplifier with transistor 44 as a load. The output from transistor 40, i.e. from the differential amplifier, is fed to emitter follower 46 and output is taken on line 48 to the balance of the amplifying circuitry. Transistors 50 and 52 constitute a second differential amplifier with transistor 51 as a load and tend to stabilize the output of transistor 46. The base of the emitter follower 46 is normally maintained above ground potential by transistors 58 and 59 which are actually connected as diodes in series and which form part of a voltage divider. This permits normal amplifying action to take place.

Line 60 leads from switch 34, as shown, through diode 62 and through line 64 to the transistor (diode) pair 58 and 59. Line 64 is also connected to ground through a small capacitor 66, e.g. 72 pf. The functioning of the circuit is now easy to see. As switch 34 closes, a large transient negative spike appears on line 60 and this signal is passed through the low pass filter 35 and capacitor 36 to the base of transistor 38 and at the same time to 58 and 59. However, as was pointed out above, there is some time delay in passing through the low pass filter and capacitor but there is no substantial delay in passing through the diode 62. Thus line 64 is grounded instantly. This, of course, cuts off the bias to transistor 46 so that no output can appear on line 48. Since there has been a substantial delay through the low pass filter and no substantial delay in cutting off the bias to transistor 46, before the transient can appear on output line 48, transistor 46 is cut off. This, of course, prevents unwanted output from the amplifier.

Now as switch 34 opens, the amplifier does not immediately turn on but some delay is introduced through capacitor 66 so that until the charge on capacitor 66 leaks off, output remains cut off. This permits the pre-amplifier to stabilize and also prevents a second transient at the time switch 34 opens. As the charge on 66 leaks off, diode 62 will become the reversed biased and thus present a high impedance and not interfere with the normal operation of the circuit until switch 34 again closes.

Although certain specific polarities and components have been shown, it will be obvious to those skilled in the art that these are only for the purpose of illustrating the present invention and that the biasing voltage and the like can be of opposite polarity by the proper selection of components.

I claim:
1. An automatic muting system for a semi-conductor phonograph pickup cartridge, said cartridge having a shorting switch for the output leads of the cartridge, said muting circuit being actuated solely by said shorting switch, comprising in combination:
   a. bias means for biasing said semi-conductor pickup cartridge through its output leads at a first polarity,
   b. first output leads from said semi-conductor pickup cartridge, said leads being connected through a passive time delay circuit to the input leads of an amplifier,
   c. bias means for said amplifier,
   d. second output leads from said semi-conductor pickup cartridge connected directly to said bias means for said amplifier, and
   e. means whereby the bias means for said amplifier is cut off when a voltage of opposite polarity is applied to said second output leads.

2. The circuit of claim 1 wherein said amplifier derives bias voltage for operation through a voltage divider circuit and wherein said bias voltage is grounded by a polarity being applied thereto of the opposite polarity.

3. The circuit of claim 1 wherein the connection to the second output circuit is bypassed by a capacitor whereby said muting circuit has a long decay time.

* * * * *